(12) United States Patent  
Yu et al.

(10) Patent No.: US 8,923,439 B1  
(45) Date of Patent: Dec. 30, 2014

(54) COMPLEMENTARY SIGNAL MIXING

(71) Applicant: Intel IP Corporation, Santa Clara, CA (US)

(72) Inventors: Chuanzhao Yu, Phoenix, AZ (US); Mark Kirschenmann, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 18 days.

(21) Appl. No.: 13/912,905

(22) Filed: Jun. 7, 2013

(51) Int. Cl.
| | |
|---|---|
| *H04L 27/20* | (2006.01) |
| *G10H 1/00* | (2006.01) |
| *H03B 28/00* | (2006.01) |
| *H04L 27/00* | (2006.01) |
| *H04L 27/18* | (2006.01) |

(52) U.S. Cl.
CPC .............. *G10H 1/0033* (2013.01); *H03B 28/00* (2013.01); *H04L 27/2071* (2013.01); *H04L 27/2092* (2013.01); *H04L 27/0008* (2013.01); *H04L 27/18* (2013.01)
USPC ............ 375/308; 375/239; 375/279; 375/329

(58) Field of Classification Search
CPC .. G10H 1/0033; H04L 27/2092; H04L 27/18; H04L 27/0008; H04L 27/0071; H03B 28/00
See application file for complete search history.

(56) References Cited

U.S. PATENT DOCUMENTS

| | | | |
|---|---|---|---|
| 7,316,745 B2 * | 1/2008 | Sadamitsu et al. | ............. 117/20 |
| 2007/0077906 A1 | 4/2007 | Kirichenko et al. | |
| 2009/0004994 A1 * | 1/2009 | Rafi et al. | ..................... 455/323 |
| 2011/0026638 A1 * | 2/2011 | Mu | ............................... 375/298 |
| 2011/0065411 A1 * | 3/2011 | Rafi et al. | ..................... 455/323 |

\* cited by examiner

*Primary Examiner* — Erin File

(74) *Attorney, Agent, or Firm* — Baker Botts L.L.P.

(57) ABSTRACT

A method of performing complementary mixing may include performing an exclusive OR (XOR) function with respect to an I-channel symbol based on an oscillator signal to produce an I-channel output signal with bits that alternate between the I-channel symbol and a complement of the I-channel symbol in response to the oscillator signal rising and falling. The method may also include performing the XOR function with respect to a Q-channel symbol based on the oscillator signal to produce a Q-channel output signal with bits that alternate between the Q-channel symbol and a complement of the Q-channel symbol in response to the oscillator signal. Further, the method may include combining the I-channel output signal and the Q-channel output signal based on adding operations performed with respect to an I-channel extra bit signal, a Q-channel extra bit signal, the I-channel output signal, and the Q-channel output signal to generate a complementary mixed signal.

20 Claims, 6 Drawing Sheets

US 8,923,439 B1

COMPLEMENTARY SIGNAL MIXING

FIELD

The embodiments discussed herein are related to complementary signal mixing.

BACKGROUND

Information may be modulated onto a carrier signal to generate a signal that may be transmitted between sources to convey the information between the sources. For example, in a wireless communication system, information may be modulated onto a radio frequency (RF) carrier signal such that the information may be wirelessly conveyed between elements (e.g., an access point and a wireless device) of the wireless communication network through transmission of the modulated RF carrier signal. In some instances, the information may be modulated onto the carrier signal by mixing a baseband signal that includes the information with the carrier signal.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of performing complementary signal mixing may include performing an exclusive OR (XOR) function with respect to an I-channel symbol based on an oscillator signal to produce an I-channel output signal with bits that alternate between the I-channel symbol and a complement of the I-channel symbol in response to the oscillator signal rising and falling. The method may also include performing the XOR function with respect to a Q-channel symbol based on the oscillator signal to produce a Q-channel output signal with bits that alternate between the Q-channel symbol and a complement of the Q-channel symbol in response to the oscillator signal rising and falling. Further, the method may include combining the I-channel output signal and the Q-channel output signal based on adding operations performed with respect to an I-channel extra bit signal, a Q-channel extra bit signal, the I-channel output signal, and the Q-channel output signal to generate a complementary mixed signal having a frequency based on a clock frequency of the oscillator signal and including information included in the I-channel symbol and the Q-channel symbol.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to some embodiments of the present disclosure, complementary signal mixing may be performed with respect to a quadrature-based modulation scheme (e.g., quadrature amplitude modulation (QAM)). For example, complementary mixing may be performed with respect to digital baseband signals that include in-phase channel (I-channel) and quadrature-phase channel (Q-channel) symbols and an oscillator signal to generate a complementary mixed quadrature signal, also referred to as a modulated quadrature signal. The modulated quadrature signal may accordingly have a frequency that is based on a clock frequency of the oscillator signal. In some embodiments, the clock frequency may be based on a desired transmission frequency of the modulated quadrature signal. For example, in some embodiments, the clock frequency may be based on a radio frequency (RF) transmission frequency of a wireless signal that may be generated based on the modulated quadrature signal.

As detailed below, in some embodiments, a complementary mixing module may be configured to perform an exclusive OR (XOR) function with respect to an I-channel symbol and an oscillator signal to produce an I-channel output signal with bits that alternate between the I-channel symbol and a complement of the I-channel symbol in response to the oscillator signal rising and falling. The complementary mixing module may also be configured to perform the XOR function with respect to a Q-channel symbol and the oscillator signal to produce a Q-channel output signal with bits that also alternate between the Q-channel symbol and a complement of the Q-channel symbol. Accordingly, the I-channel output signal and the Q-channel output signal may each have a frequency that may be based on a clock frequency of the oscillator signal and may include complements of the I-channel and Q-channel symbols, respectively. In some embodiments, the clock frequency may be associated with a desired RF carrier frequency for a wireless signal.

In some embodiments, the complementary mixing module may be configured to generate an I-channel extra bit signal and a Q-channel extra bit signal. In some embodiments, the complementary mixing module may be configured to generate a complementary mixed signal based on adding operations performed with respect to the I-channel output signal, the Q-channel output signal, the I-channel extra bit signal, and the Q-channel extra bit signal, as described in further detail below.

Accordingly, the complementary mixing module may be configured to perform complementary mixing with respect to baseband signals and an oscillator signal. In some embodiments, the complementary mixing module may be implemented with respect to one or more components of a wireless communication system.

Embodiments of the present disclosure will be explained with reference to the accompanying drawings.

Figure 1:
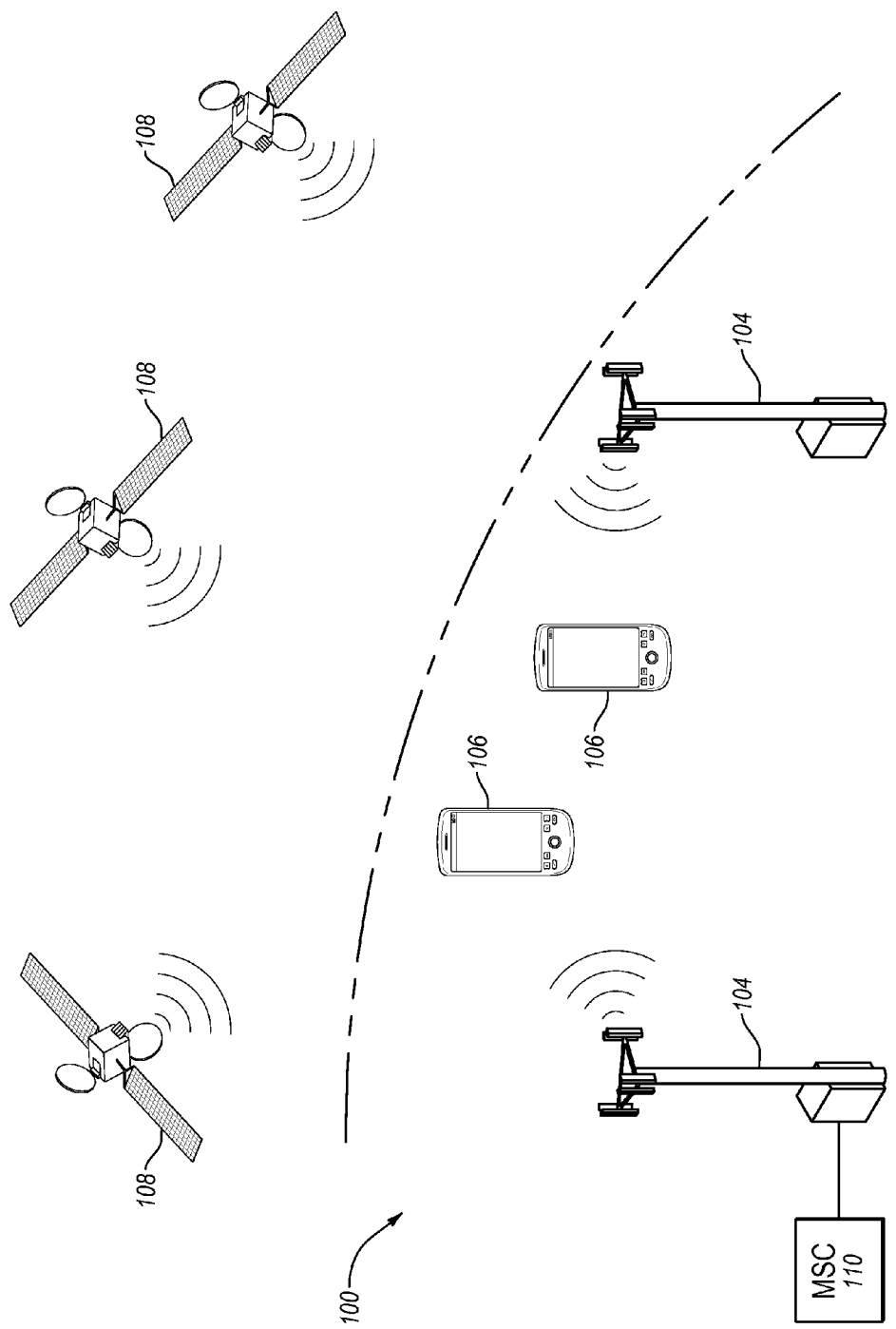
FIG. 1 illustrates an example wireless communication system.

FIG. 1 illustrates an example wireless communication system 100 (referred to hereinafter as "system 100"), arranged in accordance with at least one embodiment described herein. The system 100 may be configured to provide wireless communication services to one or more terminals 106 via one or more access points 104. Although not expressly illustrated in FIG. 1, the system 100 may include any number of access points 104 providing wireless communication services to any number of terminals 106. Additionally, with respect to the use of substantially any plural and/or singular terms herein, those having skill in the art can translate from the plural to the singular and/or from the singular to the plural as is appropriate to the context and/or application.

The wireless communication services provided by the system 100 may include voice services, data services, messaging services, and/or any suitable combination thereof. The system 100 may include a Frequency Division Duplexing (FDD) network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, and/or some other wireless communication network. In some embodiments, the system 100 may be configured to perform quadrature-based modulation. Additionally, in some embodiments, the system 100 may be configured to operate as a second generation (2G) wireless communication network, a third generation (3G) wireless communication network, a fourth generation (4G) wireless communication network, and/or a Wi-Fi network. In these or other embodiments, the system 100 may be configured to operate as a Long Term Evolution (LTE) wireless communication network.

The access point 104 may be any suitable wireless network communication point that may provide wireless communication services to the terminal 106. The access point 104 may include, by way of example but not limitation, a base station, a remote radio head (RRH), a Node B, an evolved Node B (eNB), or any other suitable communication point. In some embodiments, a mobile switching center (MSC) 110 may be communicatively coupled to the access points 104 and may provide coordination and control for the access points 104.

The terminal 106 may be any device that may use the system 100 for obtaining wireless communication services and may also be referred to as a remote station, a mobile station, an access terminal, user equipment (UE), a wireless communication device, a cellular phone, or some other terminology. For example, a terminal 106 may include, by way of example and not limitation, a cellular phone, a smartphone, a personal data assistant (PDA), a laptop computer, a personal computer, a tablet computer, a wireless communication card, or any other similar device configured to communicate within the system 100.

A terminal 106 may or may not be capable of receiving signals from one or more satellites 108. In some embodiments, the satellites 108 may belong to a satellite positioning system such as the well-known Global Positioning System (GPS). Additionally, a terminal 106 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 106 is shown as receiving signals from multiple transmitting sources simultaneously, where a transmitting source may be an access point 104 or a satellite 108. In certain embodiments, a terminal 106 may also be a transmitting source. In general, a terminal 106 may receive signals from zero, one, or multiple transmitting sources at any given moment. Additionally, for simplicity, only two terminals 106 and two access points 104 are shown in FIG. 1; however, the system 100 may include any number of terminals 106 and access points 104. In some embodiments, a terminal 106, an access point 104, or a satellite 108 may be referred to as a transmitting and/or receiving element of the network 100.

Figure 2:
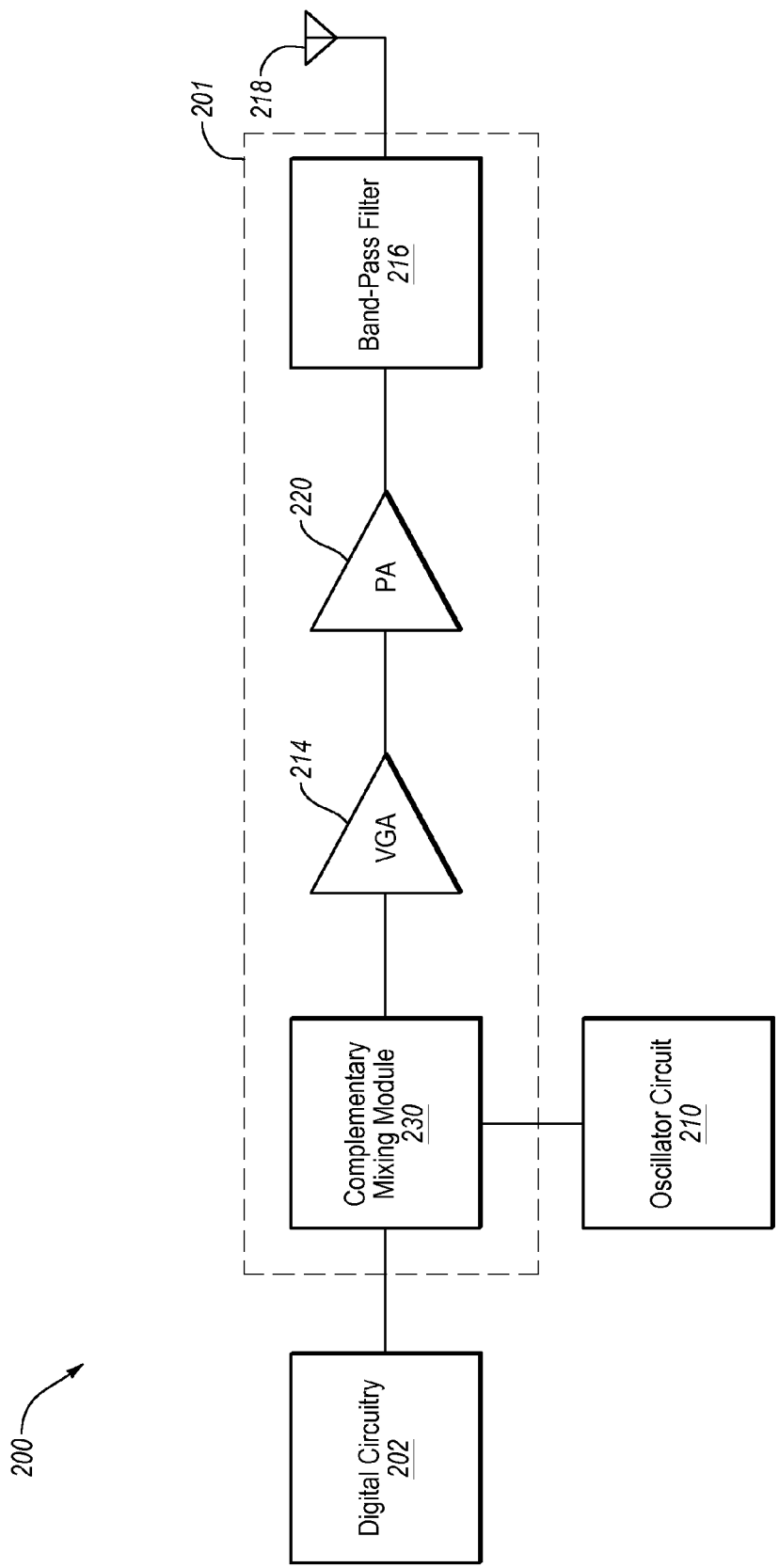
FIG. 2 illustrates a block diagram of selected components of an example transmitting and/or receiving element.

FIG. 2 illustrates a block diagram of selected components of an example transmitting and/or receiving element 200 (e.g., a terminal 106, an access point 104, or a satellite 108 of FIG. 1), arranged in accordance with at least one embodiment described herein. In the illustrated embodiment, the element 200 may include a transmit path 201, digital circuitry 202, and an oscillator circuit 210. In some embodiments, the element 200 may also include a receive path (not expressly depicted). Accordingly, depending on the functionality of the element 200, the element 200 may be considered a transmitter, a receiver, or a transceiver.

The element 200 may include digital circuitry 202 that may include any system, device, or apparatus configured to process signals and information for transmission via the transmit path 201. In some embodiments, the digital circuitry 202 may also be configured to process signals and information received via a receive path of the element 200. The digital circuitry 202 may include one or more microprocessors, microcontrollers, digital signal processors (DSP), application-specific integrated circuits (ASIC), a Field Programmable Gate Array (FPGA), or any other digital or analog circuitry configured to interpret and/or to execute program instructions and/or to process data and/or signals. In some embodiments, the program instructions and/or process data may be stored in memory.

The memory may include any suitable computer-readable media configured to retain program instructions and/or data for a period of time. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other tangible and/or non-transitory storage medium which may be used to carry or store desired program code in the form of computer-executable instructions or data structures and which may be accessed by the processor. Combinations of the above may also be included within the scope of computer-readable media. Computer-executable instructions may include, for example, instructions and data that cause a general purpose computer, a special purpose computer, or a special purpose processing device (e.g., a processor) to perform a certain function or group of functions.

The digital circuitry 202 may be configured to generate digital baseband signals that may correspond with a quadrature type modulation scheme associated with generating signals with I-channel and Q-channel components. Accordingly, the digital circuitry 202 may be configured to generate an I-channel digital baseband signal and a Q-channel digital baseband signal, which may respectively include I-channel and Q-channel symbols. The I-channel and Q-channel symbols may include information that may be transmitted by the element 200 via a wireless signal.

The transmit path 201 may include a complementary mixing module 230 configured to receive the digital baseband signals that may be generated by the digital circuitry 202. The complementary mixing module 230 may also be configured to receive an oscillator signal from the oscillator circuit 210. As mentioned above and described in further detail below with respect to FIGS. 3-5, the complementary mixing module 230 may be configured to perform complementary mixing with respect to the oscillator signal and the I and Q channel baseband signals to produce a complementary mixed (also referred to as "modulated") quadrature signal.

The oscillator circuit 210 may be any suitable device, system, or apparatus configured to produce a waveform of a particular frequency for modulation or upconversion of a signal (e.g., the digital baseband I-channel and Q-channel signals) to an applicable radio frequency. In some embodiments, the oscillator circuit 210 may also be used for demodulation or downconversion of a received wireless communication signal within the receive path of the element 200. Accordingly, the oscillator circuit 210 may produce an oscillator signal that may be used for modulation or demodulation.

In some embodiments, as also explained in further detail below, the complementary mixing module 230 may also include a digital-to-analog converter (DAC) configured to convert the modulated digital signal into a modulated analog signal such as an analog RF signal. The modulated analog signal may then be passed to one or more other components of the transmit path 201, including a variable-gain amplifier (VGA) 214. The VGA 214 may be configured to amplify the modulated analog signal for transmission of the modulated analog signal. In these and other embodiments, the transmit path 201 may include a power amplifier (PA) 220 configured to receive the modulated analog signal that may be amplified by the VGA 214. The PA 220 may also be configured to amplify the modulated analog signal.

The transmit path may additionally include a band-pass filter 216 configured to receive the modulated analog signal that may be amplified by the VGA 214 and the PA 220. The band-pass filter 216 may be configured to pass signal components of the modulated analog signal in the band-of-interest (i.e., frequency range) of the signal, and remove out-of-band noise and undesired signals. The amplified and filtered modulated analog signal may be received by the antenna 218, which may be configured to transmit the signal as a wireless communication signal.

Accordingly, the element 200 may be configured to transmit wireless communication signals. Additionally, the complementary mixing module 230 of the element 200 may be configured to perform complementary mixing to perform the modulation for the wireless communication signals that may be transmitted by the element 200.

Modifications, additions, or omissions may be made to the element 200 without departing from the scope of the present disclosure. For example, the element 200 may include any number of components not expressly described and illustrated. Further, additional components may be communicatively coupled between the components expressly described and illustrated. Additionally, in some embodiments, one or more of the expressly illustrated and described components of the element 200 may be omitted. Also, although the complementary mixing module 230 is described as being included in the element 200, the complementary mixing module 230 may be included in any suitable system, apparatus, or device to modulate signals. Accordingly, implementations of the complementary mixing module 230 are not limited to wireless communication applications.

Figure 3:
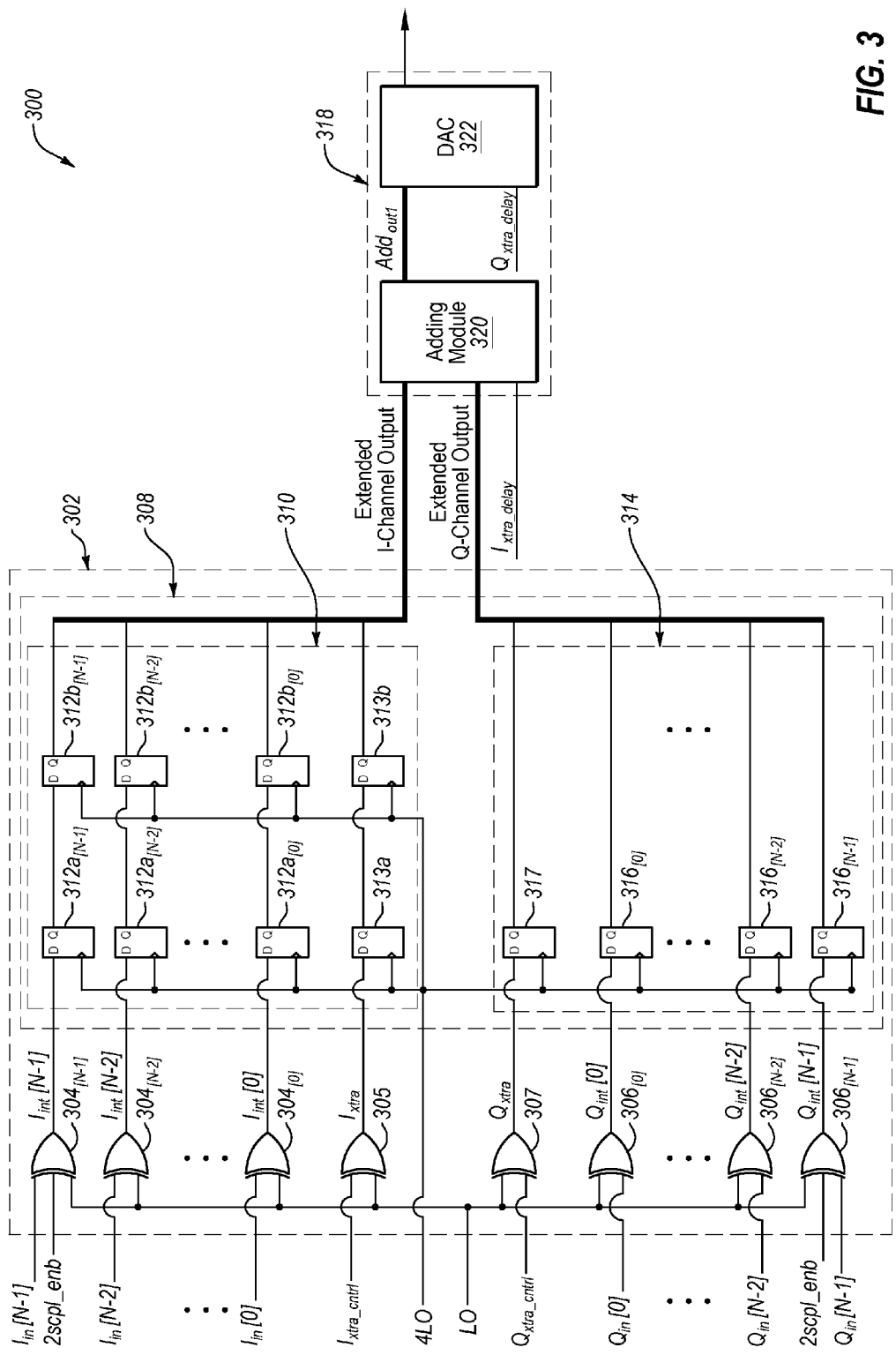
FIG. 3 illustrates a block diagram of an example embodiment of a complementary mixing module of FIG. 2.

FIG. 3 illustrates a block diagram of an example embodiment of a complementary mixing module 300 that may be used as the complementary mixing module 230 of FIG. 2, arranged in accordance with at least one embodiment described herein. In some embodiments, the complementary mixing module 300 may be configured to receive an oscillator signal from an oscillator circuit such as the oscillator circuit 210 (not expressly depicted in FIG. 3) of FIG. 2. Additionally, the complementary mixing module 300 may be configured to receive I-channel and Q-channel digital baseband signals from digital circuitry such as the digital circuitry 202 (not expressly depicted in FIG. 3) of FIG. 2. The I-channel digital baseband signal may include an I-channel symbol and the Q-channel digital baseband signal may include a Q-channel symbol.

The I-channel symbol may include I-channel information that may be represented by a series of bits that may be asserted "HIGH" or "LOW" based on the I-channel information. Similarly, the Q-channel symbol may also include Q-channel information that may be represented by a series of bits that may be asserted "HIGH" or "LOW" based on the Q-channel information.

In some embodiments, the complementary mixing module 300 may include a complement generation module 302. The complement generation module 302 may be configured to receive the I-channel digital baseband signal and the Q-channel digital baseband signal as well as the oscillator signal. The complement generation module 302 may be configured to output an I-channel output signal based on the oscillator signal and the I-channel symbol that may be included in the digital baseband I-channel signal. Additionally, the complement generation module 302 may be configured to output a Q-channel output signal based on the oscillator signal and the Q-channel symbol that may be included in the digital baseband Q-channel signal.

In some embodiments, the complement generation module 302 may include a set of I-channel logic gates configured to perform an XOR function with respect to the I-channel symbol and the oscillator signal to generate an intermediate I-channel signal, on which the I-channel output signal may be based. Therefore, bits of the intermediate I-channel signal may alternate between the I-channel symbol and a complement of the I-channel symbol based on the rising and falling edges of the oscillator signal.

In these and other embodiments, the complement generation module 302 may also include a set of Q-channel logic gates configured to perform the XOR function with respect to the Q-channel symbol and the oscillator signal to generate an intermediate Q-channel signal on which the Q-channel output signal may be based. Accordingly, bits of the intermediate Q-channel signal may alternate between the Q-channel symbol and a complement of the Q-channel symbol based on the rising and falling edges of the oscillator signal.

In the illustrated embodiment, the complement generation module 302 may include a set of I-channel XOR gates 304 as the set of I-channel logic gates and a set of Q-channel XOR gates 306 as the set of Q-channel logic gates. The set of I-channel XOR gates 304 may include an I-channel XOR gate 304 for each of the bits of the I-channel symbol and the set of Q-channel XOR gates 306 may include a Q-channel XOR gate 306 for each of the bits of the Q-channel symbol.

For example, the I-channel symbol may include "N" number of bits and may be represented by $I_{in}[N-1:0]$, where $I_{in}[N-1]$ may represent the most significant bit (MSB) of the I-channel symbol and $I_{in}[0]$ may represent the LSB of the I-channel symbol. Accordingly, the set of I-channel XOR gates 304 may include "N" number of I-channel XOR gates 304, where an I-channel XOR gate $304_{[N-1]}$ may be configured to receive $I_{in}[N-1]$, an I-channel XOR gate $304_{[N-2]}$ may be configured to receive $I_{in}[N-2]$, etc., until an I-channel XOR gate $304_{[0]}$ is configured to receive $I_{in}[0]$. Each of the I-channel XOR gates 304 may also be configured to receive the oscillator signal, which may be illustrated as "LO" in FIG. 3.

Accordingly, when the oscillator signal is "HIGH," the output of each of the I-channel XOR gates 304 may be the complement of the value of the corresponding I-channel symbol bit and when the oscillator signal is "LOW," the output of each of the I-channel XOR gates 304 may be the corresponding I-channel symbol bit. For example, when $I_{in}[N-1]$ is "HIGH" and the oscillator signal (LO) is "HIGH," the output of the I-channel XOR gate $304_{[N-1]}$ may be "LOW," and when $I_{in}[N-1]$ is "HIGH" and the oscillator signal (LO) is "LOW," the output of the I-channel XOR gate $304_{[N-1]}$ may be "HIGH." As such, the I-channel XOR gates 304 may output the intermediate I-channel signal, which may alternate between the I-channel symbol and the complement of the I-channel symbol based on the rising and falling edges of the oscillator signal.

Further, the Q-channel symbol may similarly include "N" number of bits and may be represented by $Q_{in}[N-1:0]$, where $Q_{in}[N-1]$ may represent the most significant bit (MSB) of the Q-channel symbol and $Q_{in}[0]$ may represent the LSB of the Q-channel symbol. Accordingly, the set of Q-channel XOR gates 306 may include "N" number of Q-channel XOR gates 306, where a Q-channel XOR gate $306_{[N-1]}$ may be configured to receive $Q_{in}[N-1]$, a Q-channel XOR gate $306_{[N-2]}$ may be configured to receive $Q_{in}[N-2]$, etc., until a Q-channel XOR gate $306_{[0]}$ is configured to receive $Q_{in}[0]$. Each of the Q-channel XOR gates 306 may also be configured to receive the oscillator signal LO. As such, the Q-channel XOR gates 306 may output the intermediate Q-channel signal, which may alternate between the Q-channel symbol and the complement of the Q-channel symbol based on the rising and falling edges of the oscillator signal, similar to the I-channel output signal of the I-channel XOR gates 304 alternating between the I-channel symbol and the complement of the I-channel symbol.

The complement generation module 302 may also be configured to generate an I-channel extra bit signal (illustrated in FIG. 3 and referred to herein as "$I_{xtra}$"). In the illustrated embodiment, the I-channel extra bit signal may be generated by an $I_{xtra}$ XOR gate 305, which may be configured to receive the oscillator signal and an I-channel extra bit control signal (illustrated in FIG. 3 and referred to herein as "$I_{xtra\_cntrl}$"). In the illustrated embodiment, the I-channel extra bit control signal may be set "LOW" such that the I-channel extra bit signal may be "HIGH" when the oscillator signal is "HIGH" and may be "LOW" when the oscillator signal is "LOW." Accordingly, the I-channel extra bit signal may be "HIGH" when the output of the set of I-channel XOR gates 304 is the complement of the I-channel symbol and the I-channel extra bit signal may be "LOW" when the output of the set of I-channel XOR gates 304 is the I-channel symbol.

The complement generation module 302 may be similarly configured to generate a Q-channel extra bit signal (illustrated in FIG. 3 and referred to herein as "$Q_{xtra}$"). In the illustrated embodiment, the Q-channel extra bit signal may be generated by a $Q_{xtra}$ XOR gate 307, which may be configured to receive the oscillator signal and a Q-channel extra bit control signal (illustrated in FIG. 3 and referred to herein as "$Q_{xtra\_cntrl}$"). In the illustrated embodiment, the Q-channel extra bit control signal may be set "LOW" such that the Q-channel extra bit signal may be "HIGH" when the oscillator signal is "HIGH" and may be "LOW" when the oscillator signal is "LOW." Accordingly, the Q-channel extra bit signal may be "HIGH" when the output of the set of Q-channel XOR gates 306 is the complement of the Q-channel symbol and the Q-channel extra bit signal may be "LOW" when the output of the set of Q-channel XOR gates 306 is the Q-channel symbol.

In some embodiments, the complement generation module 302 may also include a phase adjustment module 308. The phase adjustment module 308 may be configured to receive the intermediate I-channel signal and the intermediate Q-channel signal, as well as the I-channel extra bit signal and the Q-channel extra bit signal. The phase adjustment module 308 may be configured to adjust an I-channel phase of the intermediate I-channel signal with respect to a Q-channel phase of the intermediate Q-channel signal such that the I-channel phase is offset from the Q-channel phase by approximately 90 degrees to generate the I-channel output signal and the Q-channel output signal. Accordingly, the I-channel phase of the I-channel output signal and the Q-channel phase of the Q-channel output signal may be offset by approximately 90 degrees. In the illustrated embodiment, the phase adjustment module 308 may be configured such that the I-channel phase may lag the Q-channel phase by approximately 90 degrees. In other embodiments, the phase adjustment module 308 may be configured such that the Q-channel phase may lag the I-channel phase by approximately 90 degrees. The phase adjustment module may also be configured such that the phases of the I-channel extra bit signal and the Q-channel extra bit signal may be offset by approximately 90 degrees also.

In the illustrated embodiment, the phase adjustment module 308 may include an I-channel delay module 310 that may include a set of I-channel flip-flops 312. In the illustrated embodiment, the set of I-channel flip-flops 312 may be configured to receive the intermediate I-channel signal and may include two I-channel flip-flops 312 coupled in series for each bit of the intermediate I-channel signal. For example, the intermediate I-channel signal may include "N" number bits, where bits [N-1] through [0] ($I_{int}[N-1:0]$) may be the output of the set of I-channel XOR gates 304. Accordingly, in the illustrated embodiment, the set of I-channel flip-flops 312 may include "2*(N)" I-channel flip-flops 312 where an I-channel flip-flop $312a_{[N-1]}$ and an I-channel flip-flop $312b_{[N-1]}$ may be configured to sequentially receive $I_{int}[N-1]$ from the I-channel XOR gate $304_{[N-1]}$ (e.g., the I-channel flip-flop $312a_{[N-1]}$ may receive $I_{int}[N-1]$ and then the I-channel flip-flop $312b_{[N-1]}$ may receive $I_{int}[N-1]$ from the I-channel flip-flop $312a_{[N-1]}$), an I-channel flip-flop $312a_{[N-2]}$ and an I-channel flip-flop $312b_{[N-2]}$ may be configured to sequentially receive $I_{int}[N-2]$ from the I-channel XOR gate $304_{[N-2]}$, etc., until an I-channel flip-flop $312a_{[0]}$ and an I-channel flip-flop $312b_{[0]}$ are configured to sequentially receive $I_{int}[0]$ from the I-channel XOR gate $304_{[0]}$. Additionally, in some embodiments, the I-channel delay module 310 may include an I-channel extra flip-flop 313a and an I-channel extra flip-flop 313b configured to sequentially receive the I-channel extra bit signal from the $I_{xtra}$ XOR gate 305.

In some embodiments, the I-channel flip-flops 312 and the I-channel extra flip-flops 313 may be configured to be driven by a clock signal (illustrated as "4LO" in FIG. 3) that may be four times the frequency of the oscillator signal. Therefore, the intermediate I-channel signal may step through the I-channel flip-flops 312a at one-fourth the period of the oscillator signal and may then also step through the I-channel flip-flops 312b at one-fourth of the period of the oscillator signal to be output by the I-channel flip-flops 312b as the I-channel output signal of the complement generation module 302. Accordingly, the I-channel flip-flops 312a may induce a delay of one-fourth the period of the oscillator signal and the I-channel flip-flops 312b may induce another delay of one-fourth of the period of the oscillator signal such the I-channel output signal may be delayed by one-half the period of the oscillator signal with respect to the intermediate I-channel signal as. Similarly, the I-channel extra bit signal may step through the I-channel extra flip-flops 313 to induce a delay of one-half the period of the oscillator signal, which may generate a delayed I-channel extra bit signal.

In some embodiments, the complement generation module 302 may be configured to combine the delayed I-channel extra bit signal with the I-channel output signal to generate an extended I-channel output signal where the delayed I-channel extra bit signal may be used as the LSB of the extended I-channel output signal. For example, after the combination, the extended I-channel output signal may include "N+1" number bits where bits [N] through [1] may be the I-channel output signal that may be the output of the I-channel flip-flops 312b and where bit [0] may be the delayed I-channel extra bit signal that may be output by the I-channel extra flip-flop 313b.

Additionally, in the illustrated embodiment, the phase adjustment module 308 may include a Q-channel delay module 314 that may include a set of Q-channel flip-flops 316. In the illustrated embodiment, the set of Q-channel flip-flops 316 may be configured to receive the intermediate Q-channel signal and may include a Q-channel flip-flop 316 for each bit of the intermediate Q-channel signal. For example, the intermediate Q-channel signal may include "N" number bits, where bits [N-1] through [0] ($Q_{int}$[N-1:0]) may be the output of the set of Q-channel XOR gates 306. Accordingly, in the illustrated embodiment, the set of Q-channel flip-flops 316 may include "N" Q-channel flip-flops 316, where a Q-channel flip-flop $316_{[N-1]}$ may be configured to receive $Q_{int}$[N-1] from the Q-channel XOR gate $306_{[N-1]}$, a Q-channel flip-flop $316_{[N-2]}$ may be configured to receive $Q_{int}$[N-2] from the Q-channel XOR gate $306_{[N-2]}$, etc., until a Q-channel flip-flop $316_{[0]}$ is configured to receive $Q_{int}$[0] from the Q-channel XOR gate $306_{[0]}$. Additionally, in some embodiments, the Q-channel delay module 314 may include a Q-channel extra flip-flop 317 configured to receive the Q-channel extra bit signal from the 0 xtra XOR gate 307.

In some embodiments, the Q-channel flip-flops 316 may also be configured to be driven by the clock signal 4LO such that the intermediate Q-channel signal may step through the Q-channel flip-flops 316 at one-fourth the period of the oscillator signal to be output by the Q-channel flip-flops 316 as the Q-channel output signal. Accordingly, the Q-channel flip-flops 316 may induce a delay of one-fourth the period of the oscillator signal such that output of the intermediate Q-channel signal as the Q-channel output signal may be delayed by one-fourth the period of the oscillator signal. Consequently, in the illustrated embodiment, the Q-channel output signal may lead the I-channel output signal by one-fourth the period of the oscillator signal such that the Q-channel phase of the Q-channel output signal may be offset from the I-channel phase of the I-channel output signal by 90 degrees. Similarly, the I-channel extra flip-flop 317 may be configured to be driven by the clock signal 4LO such that the I-channel extra bit signal may step through the Q-channel extra flip-flop 317 to induce a delay of one-fourth the period of the oscillator signal, which may generate a delayed Q-channel extra bit signal with a phase that may lead the delayed I-channel extra bit signal by 90 degrees.

In some embodiments, the complement generation module 302 may be configured to combine the delayed Q-channel extra bit signal with the Q-channel output signal to generate an extended Q-channel output signal where the delayed Q-channel extra bit signal may be used as the LSB of the extended I-channel output signal. For example, after the combination, the extended Q-channel output signal may include "N+1" number bits where bits [N] through [1] may be the Q-channel output signal that may be the output of the Q-channel flip-flops 316 and where bit [0] may be the delayed Q-channel extra bit signal that may be output by the Q-channel extra flip-flop 317.

Additionally, in some embodiments, the complement generation module 302 may be configured to toggle between performing the above-described operations with respect to the I-channel and Q-channel signals when the I-channel and Q-channel symbols are in a two's complement format or an unsigned binary format. For example, in the illustrated embodiment, the I-channel XOR gate $304_{[N-1]}$ that may correspond to the MSB of the I-channel symbol may be configured to receive a two's complement enable signal (illustrated as 2scpl_enb in FIG. 3). The Q-channel XOR gate $306_{[N-1]}$ that may correspond to the MSB of the Q-channel symbol may also be configured to receive the two's complement enable signal. The two's complement enable signal may be set "LOW" when the format of the I-channel and Q-channel symbols is a two's complement format, and the two's complement enable signal may be set "HIGH" when the format of the I-channel and Q-channel symbols is an unsigned binary format. In some embodiments, the two's complement enable signal may be set by a component of the digital circuitry (not expressly depicted in FIG. 3) such as a component of the digital circuitry 202 of FIG. 2. Accordingly, the complement generation module 302 may be configured to toggle between receiving the I-channel and Q-channel symbols in the two's complement format or the unsigned binary format.

The complementary mixing module 300 may also include a combining module 318 configured to receive the extended I-channel output signal and the extended Q-channel output signal from the complement generation module 302. The combining module 318 may be configured to combine the extended I-channel output signal with the extended Q-channel output signal to generate a complementary mixed signal that may include information that may be included in the I-channel symbol and the Q-channel symbol. Additionally, in some embodiments, the combining module 318 may be configured to perform adding operations with respect to the delayed I-channel extra bit signal, the delayed Q-channel extra bit signal, the extended I-channel output signal, and the extended Q-channel output signal to generate the complementary mixed signal, as described below.

For example, in some embodiments, the combining module 318 may include an adding module 320 configured to receive the extended I-channel output signal and the extended Q-channel output signal from the complement generation module 302. The adding module 320 may also be configured to receive the delayed I-channel extra bit signal. In the illustrated embodiment of FIG. 3, the delayed I-channel extra bit signal received by the adding module 320 is depicted as "$I_{xtra\_delay}$". In other embodiments, the adding module 320 may be configured to receive the delayed Q-channel extra bit signal, instead of the delayed I-channel extra bit signal. The adding module 320 may be configured to add the extended I-channel output signal, the extended Q-channel output signal and the delayed I-channel extra bit signal to generate a sum of the extended I-channel output signal, the extended Q-channel output signal and the delayed I-channel extra bit signal. The adding module 320 may also be configured to drop the LSB of the sum of the extended I-channel output signal, the extended Q-channel output signal, and the delayed I-channel extra bit signal to generate an adder output signal.

For example, the extended I-channel output signal ($I_{out\_xtnd}$) may include "N+1" number bits, where the values at bits "N" through "1" ($I_{out\_xtnd}[N:1]$) may be related to the I-channel symbol and the value at bit "0" ($I_{out\_xtnd}[0]$) may be the value of the delayed I-channel extra bit signal. Similarly, the extended Q-channel output signal ($Q_{out\_xtnd}$) may include "N+1" number bits, where the values at bits "N" through "1" ($Q_{out\_xtnd}[N:1]$) may be related to the Q-channel symbol and the value at bit "0" ($Q_{out\_xtnd}[0]$) may be the value of the delayed Q-channel extra bit signal. $I_{out}$, $Q_{out\_xtnd}$, and $I_{xtra\_delay}$ may be added by the adding module 320 to generate a sum (sum[N:0]) that may also include "N+1" number bits with values at each bit being based on the adding of $I_{out\_xtnd}$, $Q_{out\_xtnd}$, and $I_{xtra\_delay}$. In some embodiments, the adding of $I_{out\_xtnd}$, $Q_{out\_xtnd}$, and $I_{xtra\_delay}$ to generate sum [N:0] may be performed as expressed below:

|   | $I_{out\_xtnd}[N]$ | $I_{out\_xtnd}[N-1]$ | $I_{out\_xtnd}[N-2]$ | ... | $I_{out\_xtnd}[1]$ | $I_{out\_xtnd}[0]$ |
|---|---|---|---|---|---|---|
| + | $Q_{out\_xtnd}[N]$ | $Q_{out\_xtnd}[N-1]$ | $Q_{out\_xtnd}[N-2]$ | ... | $Q_{out\_xtnd}[1]$ | $Q_{out\_xtnd}[0]$ |
| + | 0 | 0 | 0 | 0 | | $I_{xtra\_delay}$ |
| = | sum[N] | sum[N-1] | sum[N-2] | | sum[1] | sum[0] |

The adding module 320 may also be configured to drop the LSB of the sum[N:0] to generate the adder output signal such that the adder output signal (illustrated as "$Add_{out1}$" in FIG. 3) may be the sum[N:1]. Therefore the adder output signal may include "N" number of bits where $Add_{out1}[N-1]$ may represent the value of $sum_1[N]$ and $Add_{out1}[0]$ may represent the value of $sum_1[1]$.

The combining module 318 may also include a summing DAC 322 configured to receive the adder output signal and the delayed Q-channel extra bit signal. In the illustrated embodiment of FIG. 3, the delayed Q-channel extra bit signal received by the summing DAC 322 is depicted as "$Q_{xtra\_delay}$". The summing DAC 322 may be configured to add the delayed Q-channel extra bit signal to the adder output signal during the digital-to-analog conversion of the adder output signal. Accordingly, the analog signal that may be output by the summing DAC 322 may be a representation of the sum of the adder output signal ($Add_{out1}$) and the delayed Q-channel extra bit signal ($sum_2$). In some embodiments, the adding of $Add_{out1}$ and $Q_{xtra\_delay}$ to generate $sum_2$ [N-1:0] may be performed as expressed below:

|   | $Add_{out1}[N-1]$ | $Add_{out1}[N-2]$ | ... | $Add_{out1}[1]$ | $Add_{out1}[0]$ |
|---|---|---|---|---|---|
| + | 0 | 0 | ... | 0 | $Q_{xtra\_delay}$ |
| = | $sum_2[N-1]$ | $sum_2[N-2]$ | ... | $sum_2[1]$ | $sum_2[0]$ |

As such, the analog signal output by the summing DAC 322 may be a carrier wave modulated with the information that may be included in the I-channel symbols and the Q-channel symbols that may be included in the I-channel and the Q-channel digital baseband signals that may be received by the complementary mixing module 300. Accordingly, the analog signal output by the summing DAC 322 may be complementary mixed signal that may be based on the I-channel and Q-channel symbols that may be received by the complementary mixing module 300. Additionally, the adding operations performed by the adding module 320 and the summing DAC 322 of the combining module 318 with respect to $I_{out\_xtnd}$, $Q_{out\_xtnd}$, $I_{xtra\_delay}$, and $Q_{xtra\_delay}$ may allow for more complete and accurate modulation of the I-channel and Q-channel information in the complementary mixed signal that may be output by the summing DAC 322 as compared to modulation that may not perform the adding operations described above.

Modifications, additions, or omissions may be made to FIG. 3 without departing from the scope of the present disclosure. For example, the phase difference between the I-channel and Q-channel output signals and I-channel and Q-channel extra bit signals may be obtained using any suitable process. By way of example, in some embodiments, the I-channel flip-flops 312a, the I-channel extra flip-flop 313a, the Q-channel flip-flops 316 and the Q-channel extra flip-flop 317 may be driven by a clock signal with a frequency twice that of the oscillator signal. In these and other embodiments, the I-channel flip-flops 312b may be driven by another clock signal with a frequency that may also be twice that of the oscillator signal, but that may be 90 degrees out of phase with respect to the clock signal that may be driving the I-channel flip-flops 312a, the I-channel extra flip-flop 313a, the Q-channel flip-flops 316 and the Q-channel extra flip-flop 317. Such a configuration may also cause the phase of the I-channel output signal and the delayed I-channel extra bit signal to lag the phase of the Q-channel output signal and the delayed Q-channel extra bit signal by approximately 90 degrees.

Figure 4:
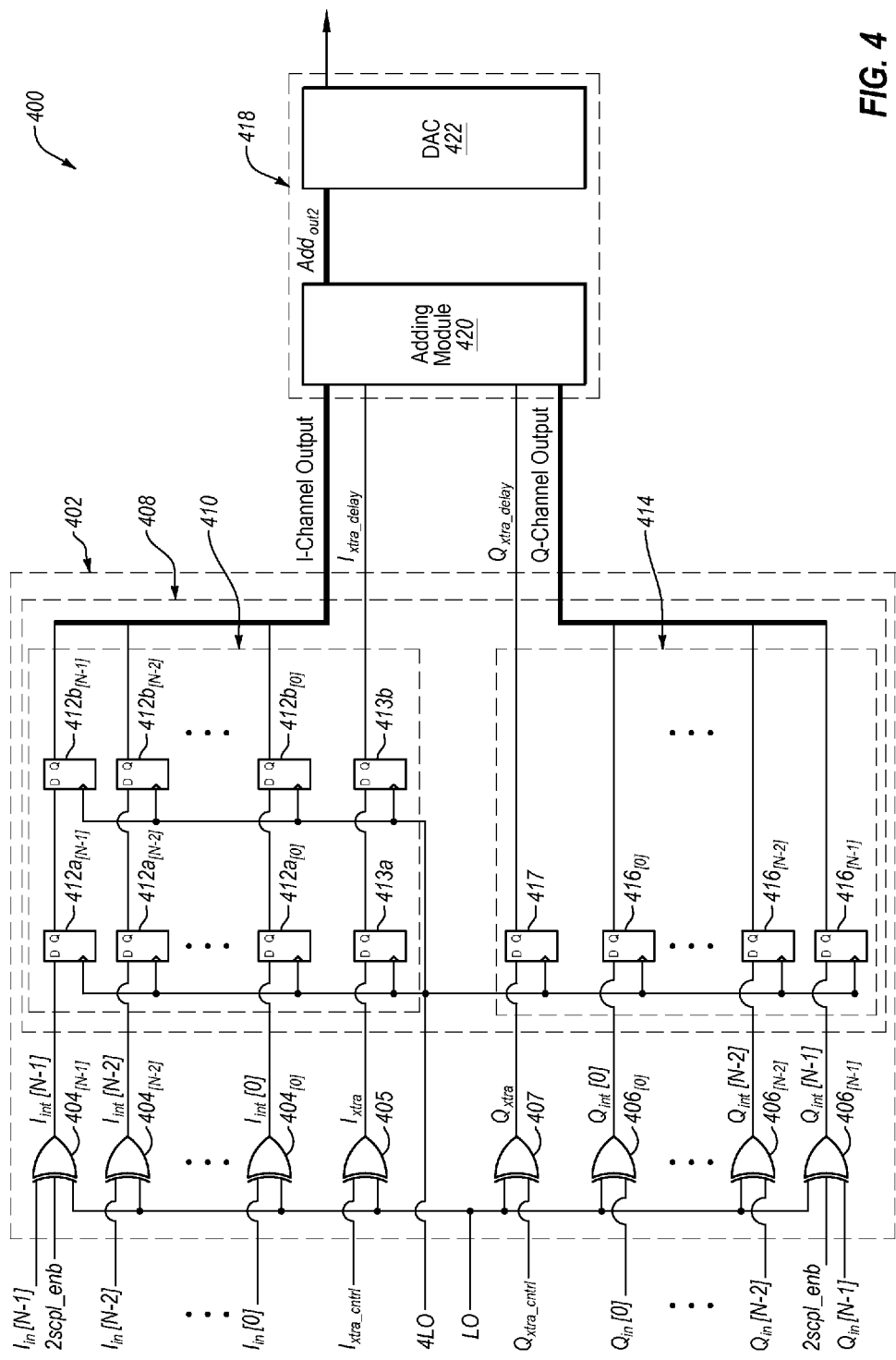
FIG. 4 illustrates a block diagram of another example embodiment of the complementary mixing module of FIG. 2.

FIG. 4 illustrates a block diagram of an example embodiment of a complementary mixing module 400 that may be used as the complementary mixing module 230 of FIG. 2, arranged in accordance with at least one embodiment described herein. In some embodiments, the complementary mixing module 400 may include a complement generation module 402 that may be configured to generate the intermediate I-channel signal, the I-channel output signal, the intermediate Q-channel signal, the Q-channel output signal, the I-channel extra bit signal, the Q-channel extra bit signal, the delayed I-channel extra bit signal, and the delayed Q-channel extra bit signal in a manner analogous to that described above with respect to the complement generation module 302 of FIG. 3. Accordingly, in some embodiments, the complement generation module 402 may include I-channel XOR gates 404, an $I_{xtra}$ XOR gate 405, Q-channel XOR gates 406, a $Q_{xtra}$ XOR gate 407, and a phase adjustment module 408 including an I-channel delay module 410 that may include flip-flops 412 and 413, and a Q-channel delay module 414 that may include flip-flops 416 and a flip-flop 417 that may operate in manner analogous to the I-channel XOR gates 304, the $I_{xtra}$ XOR gate 305, the Q-channel XOR gates 306, the $Q_{xtra}$ XOR gate 307, and the phase adjustment module 308 including the I-channel delay module 310 that may include the flip-flops 312 and 313, and the Q-channel delay module that may include the flip-flops 316 and the flip-flop 317, respectively, of FIG. 3.

However, unlike the complement generation module 302 of FIG. 3, the complement generation module 402 may not be configured to combine the I-channel output signal with the delayed I-channel extra bit signal to generate the extended I-channel output signal. Further, the complement generation module 402 may not be configured to combine the Q-channel output signal with the delayed Q-channel extra bit signal to generate the extended Q-channel output signal.

In the illustrated embodiment, the complementary mixing module 400 may include a combining module 418 that may include an adding module 420 configured to receive the I-channel output signal, the delayed I-channel extra bit signal, the Q-channel output signal, and the delayed Q-channel extra bit signal that may be generated by the complement generation module 402. The adding module 420 may be configured to perform an adding operation with respect to the I-channel output signal (also referred to herein as "$I_{out}$"), the delayed I-channel extra bit signal (illustrated in FIG. 4 and also referred to herein as "$I_{xtra\_delay}$"), the Q-channel output signal (also referred to herein as "$Q_{out}$"), and the delayed Q-channel extra bit signal (illustrated in FIG. 4 and referred to herein as "$Q_{xtra\_delay}$") to generate an adder output signal (illustrated in FIG. 4 and also referred to herein as "$Add_{out2}$"). In some embodiments, the adder output signal of the adding module 420 may be represented by the following expression:

$$Add_{out2} = I_{out} + Q_{out} + I_{xtra\_delay} + Q_{xtra\_delay}$$

The combining module 418 may also include a summing DAC 422 configured to perform an adding operation with respect to the adder output signal $Add_{out2}$ of the adding module 420 to generate a complementary mixed signal modulated with the information that may be included in the I-channel symbols and the Q-channel symbols that may be included in the I-channel and the Q-channel digital baseband signals that may be received by the complementary mixing module 400. For example, in some embodiments, the adder output signal $Add_{out2}$ may include "N+2" number bits and the adding DAC 422 may be configured to perform operations represented by the following expression:

$$out = A \sum_{k=0}^{N+1} 2^k * Add_{out2}[k]$$

In the above expression, "out" may represent the complementary mixed signal, "A" may represent the gain of the summing DAC 422 and "$Add_{out2}[k]$" may represent the value of the adder output signal $Add_{out2}$ at the bit index number "k."

As such, the analog signal output by the summing DAC 422 may be a complementary mixed signal with the information that may be included in the I-channel symbols and the Q-channel symbols that may be included in the I-channel and the Q-channel digital baseband signals that may be received by the complementary mixing module 400. Additionally, the adding operations performed by the adding module 420 and the summing DAC 422 of the combining module 418 may allow for more complete and accurate modulation of the I-channel and Q-channel information in the complementary mixed signal that may be output by the summing DAC 422 as compared to modulation that may not perform the adding operations described above.

Modifications, additions, or omissions may be made to FIG. 4 without departing from the scope of the present disclosure. For example, the phase difference between the I-channel and Q-channel output signals and I-channel and Q-channel extra bit signals may be obtained using any suitable process.

Figure 5:
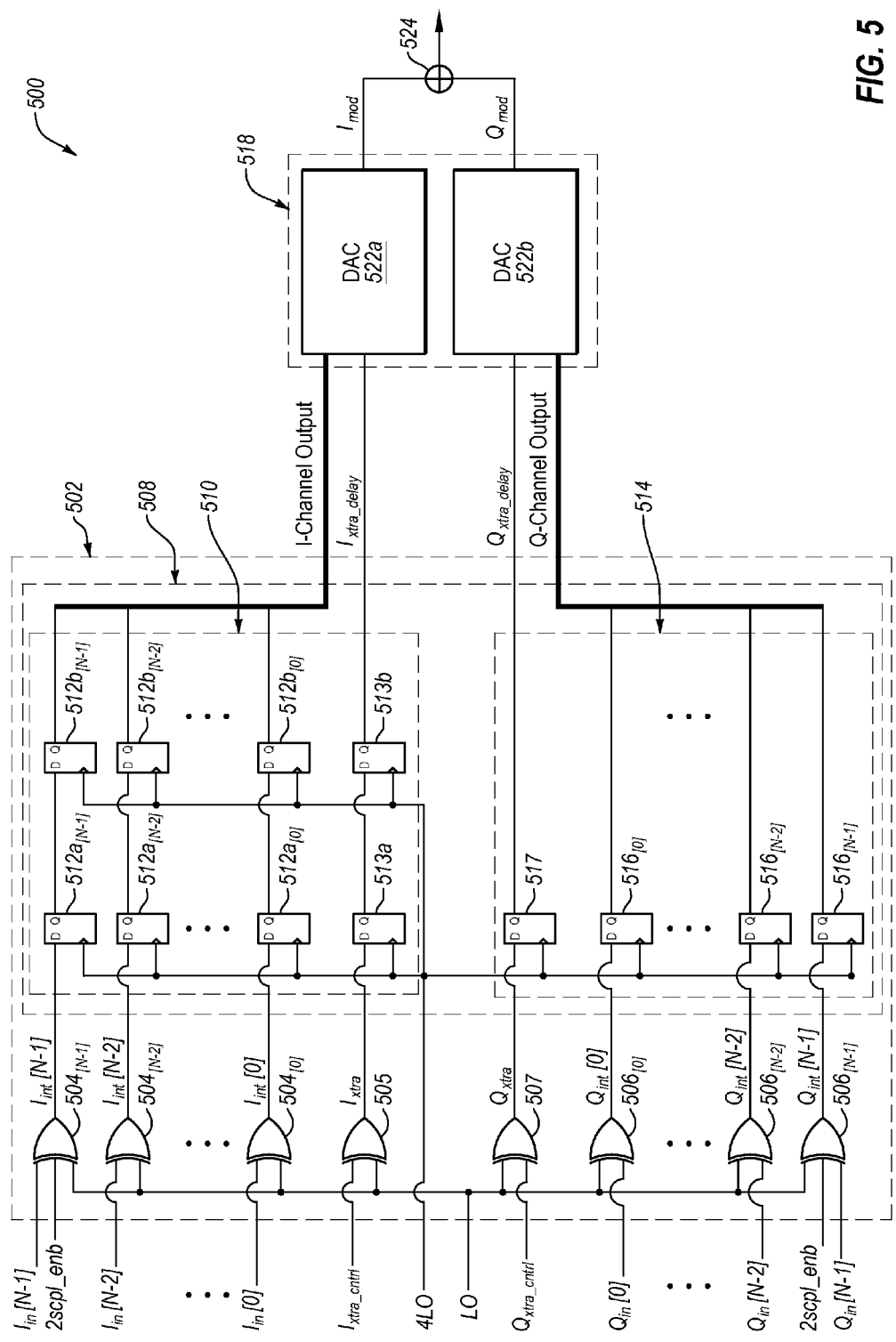
FIG. 5 illustrates a block diagram of another example embodiment of the complementary mixing module of FIG. 2.

FIG. 5 illustrates a block diagram of an example embodiment of a complementary mixing module 500 that may be used as the complementary mixing module 230 of FIG. 2, arranged in accordance with at least one embodiment described herein. In some embodiments, the complementary mixing module 500 may include a complement generation module 502 that may be configured to generate the intermediate I-channel signal, the I-channel output signal, the intermediate Q-channel signal, the Q-channel output signal, the I-channel extra bit signal, the Q-channel extra bit signal, the delayed I-channel extra bit signal, and the delayed Q-channel extra bit signal in a manner analogous to that described above with respect to the complement generation module 302 of FIG. 3. Accordingly, the complement generation module 502 may include I-channel XOR gates 504, an $I_{xtra}$ XOR gate 505, Q-channel XOR gates 506, a $Q_{xtra}$ XOR gate 507, and a phase adjustment module 408 including an I-channel delay module 510 that may include flip-flops 512 and 513, and a Q-channel delay module 514 that may include flip-flops 516 and a flip-flop 517 that may operate in manner analogous to the I-channel XOR gates 304, the $I_{xtra}$ XOR gate 305, the Q-channel XOR gates 306, the $Q_{xtra}$ XOR gate 307, and the phase adjustment module 308 including the I-channel delay module 310 that may include the flip-flops 312 and 313, and the Q-channel delay module that may include the flip-flops 316 and the flip-flop 317 of FIG. 3.

However, unlike the complement generation module 302 of FIG. 3 and similar to the complement generation module 402 of FIG. 4, the complement generation module 502 may not be configured to combine the I-channel output signal with the delayed I-channel extra bit signal to generate the extended I-channel output signal. Further, the complement generation module 502 may not be configured to combine the Q-channel output signal with the delayed Q-channel extra bit signal to generate the extended Q-channel output signal.

In the illustrated embodiment, the complementary mixing module 500 may include a combining module 518 that may include a summing DAC 522a and a summing DAC 522b. The summing DAC 522a may be configured to receive the I-channel output signal and the delayed I-channel extra bit signal and the summing DAC 522b may be configured to receive the Q-channel output signal and the delayed Q-channel extra bit signal that may be generated by the complement generation module 502. The summing DAC 522a may be configured to perform an adding operation with respect to the I-channel output signal ($I_{out}$) and the delayed I-channel extra bit signal ($I_{xtra\_delay}$) to generate a modulated I-channel signal (illustrated and referred to herein and in FIG. 5 as "$I_{mod}$"). Further, the summing DAC 522b may be configured to perform an adding operation with respect to the Q-channel output signal ($Q_{out}$), and the delayed Q-channel extra bit signal ($Q_{xtra\_delay}$) to generate a modulated Q-channel signal (illustrated and referred to herein and in FIG. 5 as "$Q_{mod}$"). In some embodiments, the generation of the modulated I-channel signal by the summing DAC 522a may be represented by the following expression:

$$I_{mod} = A_{522a} \sum_{k=0}^{N-1} 2^k * I_{out}[k] + I_{xtra\_delay}$$

In the above expression, "$I_{mod}$" may represent the modulated I-channel signal, "$A_{522a}$" may represent the gain of the summing DAC 522a, "$I_{out}[k]$" may represent the value of the I-channel output signal at the bit index number "k," and "$I_{xtra\_delay}$" may represent the delayed I-channel extra bit signal.

Similarly, in some embodiments, the generation of the modulated Q-channel signal by the summing DAC 522b may be represented by the following expression:

$$Q_{mod} = A_{522b} \sum_{k=0}^{N-1} 2^k * Q_{out}[k] + Q_{xtra\_delay}$$

In the above expression, "$Q_{mod}$" may represent the modulated Q-channel signal, "$A_{522b}$" may represent the gain of the summing DAC 522b, "$Q_{out}[k]$" may represent the value of the Q-channel output signal at the bit index number "k," and "$Q_{xtra\_delay}$" may represent the delayed Q-channel extra bit signal.

The combining module 518 may also include an analog mixing module 524 configured to combine the modulated I-channel signal with the modulated Q-channel signal to generate a complementary mixing module that may be output by the mixing module 524. As such, the analog signal output by the combining module 518 may be a complementary mixed signal with the information that may be included in the I-channel symbols and the Q-channel symbols that may be included in the I-channel and the Q-channel digital baseband signals that may be received by the complementary mixing module 500. Additionally, the adding operations performed by the summing DACs 522 and the mixing performed by the mixing module 524 may allow for more complete and accurate modulation of the I-channel and Q-channel information in the complementary mixed signal that may be output by the mixing module 524 as compared to modulation that may not perform the adding operations described above.

Modifications, additions, or omissions may be made to FIG. 5 without departing from the scope of the present disclosure. For example, the phase difference between the I-channel and Q-channel output signals and I-channel and Q-channel extra bit signals may be obtained using any suitable process.

Figure 6:
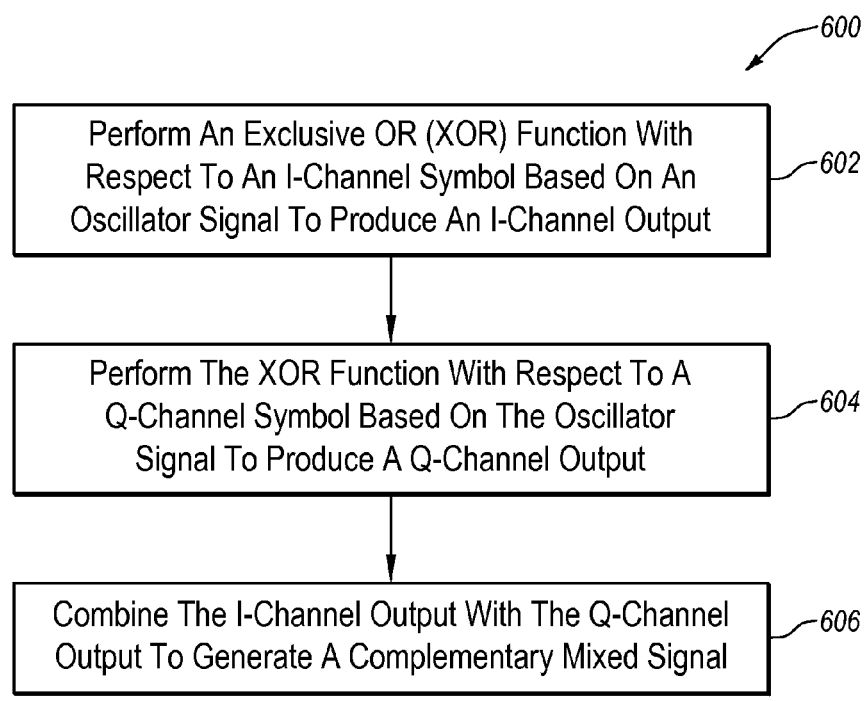
FIG. 6 illustrates a flowchart of an example method of performing complementary signal mixing.

FIG. 6 is a flowchart of an example method 600 of performing complementary mixing, arranged in accordance with at least one embodiment described herein. The method 400 may be implemented, in some embodiments, by a complementary mixing module of a transmitting element, such as the complementary mixing modules 230, 300, 400, and 500 described with respect to FIGS. 2-5. Although illustrated as discrete blocks, various blocks may be divided into additional blocks, combined into fewer blocks, or eliminated, depending on the desired implementation.

The method 600 may begin at block 602 where an exclusive OR (XOR) function may be performed with respect to a digital baseband I-channel symbol based on an oscillator signal. The XOR function may be performed to produce an I-channel output signal with bits that alternate between the I-channel symbol and a complement of the I-channel symbol in response to the oscillator signal rising and falling.

At a block 604, the XOR function may be performed with respect to a Q-channel symbol based on the oscillator signal. The XOR function may be performed to produce a Q-channel output signal with bits that alternate between the Q-channel symbol and a complement of the Q-channel symbol in response to the oscillator signal rising and falling.

At a block 606, the I-channel output signal may be combined with the Q-channel output signal based on adding operations performed with respect to an I-channel extra bit signal, a Q-channel extra bit signal, the I-channel output signal, and the Q-channel output signal to generate a complementary mixed signal having a frequency based on a clock frequency of the oscillator signal and including information included in the I-channel symbol and the Q-channel symbol. In some embodiments, the clock frequency may be based on a desired transmission frequency of a wireless signal that may be generated based on the modulated signal.

Accordingly, the method 600 may be performed to perform complementary mixing of a signal. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 600 may include operations associated with adjusting for the I-channel symbol and the Q-channel symbol having a two's complement format or an unsigned binary code format. Additionally, the method 600 may include operations associated with generating intermediate I-channel and Q-channel signals based on performing the XOR functions and adjusting an I-channel phase of the intermediate I-channel signal with respect to a Q-channel phase of the intermediate Q-channel signal to generate the I-channel output signal and the Q-channel output signal such that the I-channel output signal and Q-channel output signal are substantially 90 degrees out of phase with each other. In some embodiments, the operations may include delaying the intermediate I-channel signal by substantially one-half of a clock period of the oscillator signal to generate the I-channel output signal and delaying the intermediate Q-channel signal by substantially one-fourth of the clock period to generate the Q-channel output signal. In other embodiments, the operations may include delaying the intermediate I-channel signal by substantially one-fourth of the clock period to generate the I-channel output signal and delaying the intermediate Q-channel signal by substantially one-half of the clock period to generate the Q-channel output signal.

Further, in some embodiments, the method 600 may include operations associated combining the I-channel extra bit signal with the I-channel output signal to generate an extended I-channel output signal where a least significant bit of the I-channel output signal may be based on the I-channel extra bit signal. The method 600 may also include operations associated with combining the Q-channel extra bit signal with the Q-channel output signal to generate an extended Q-channel output signal where a least significant bit of the Q-channel output signal may be based on the Q-channel extra bit signal. Further, in these and other embodiments, the method 600 may include operations associated with adding the I-channel extra bit signal, the extended I-channel output signal, and the extended Q-channel output signal together to generate an adder output signal and adding the Q-channel extra bit signal with the adder output signal during a digital-to-analog conversion of the adder output signal to generate the complementary mixed signal. In other embodiments, the operations may include adding the Q-channel extra bit signal, the extended I-channel output signal, and the extended Q-channel output signal together to generate the adder output signal and adding the I-channel extra bit signal with the adder output signal during the digital-to-analog conversion of the adder output signal to generate the complementary mixed signal.

Moreover, in some embodiments, the method 600 may include operations associated with receiving the oscillator signal and an I-channel extra bit control signal and performing the XOR function with respect to the oscillator signal and the I-channel extra bit control signal to generate the I-channel extra bit signal such that the I-channel extra bit signal alternates between "LOW" and "HIGH" in response to the oscillator signal rising and falling. In these or other embodiments, the method 600 may include operations associated with receiving the oscillator signal and a Q-channel extra bit control signal and performing the XOR function with respect to the oscillator signal and the Q-channel extra bit control signal to generate the Q-channel extra bit signal such that the Q-channel extra bit signal alternates between "LOW" and "HIGH" in response to the oscillator signal rising and falling.

Additionally, in these or other embodiments, the operations may include removing a least significant bit of the sum of the I-channel extra bit signal, the extended I-channel output signal, and the extended Q-channel output signal to generate the adder output signal, or removing a least significant bit of the sum of the Q-channel extra bit signal, the extended I-channel output signal, and the extended Q-channel output signal to generate the adder output signal.

Further, in some embodiments, the method 600 may include operations associated with adding the I-channel extra bit signal, the Q-channel extra bit signal, the I-channel output signal, and the Q-channel output signal together to generate an adder output signal and performing an adding operation with respect to the adder output signal during a digital-to-analog conversion of the adder output signal to generate the complementary mixed signal. Moreover, in some embodiments, the method 600 may include operations associated with performing a first adding operation with respect to the I-channel extra bit signal and the I-channel output signal during a digital-to-analog conversion of the I-channel output signal to generate a modulated I-channel signal. The operations may also include performing a second adding operation with respect to the Q-channel extra bit signal and the Q-channel output signal during a digital-to-analog conversion of the Q-channel output signal to generate a modulated Q-channel signal. In these and other embodiments, the operations may additionally include combining the modulated I-channel signal with the modulated Q-channel signal to generate the complementary mixed signal.

The embodiments described herein may include the use of a special purpose or general purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. As mentioned above, and by way of example and not limitation, such computer-readable media may include tangible computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a special purpose or general purpose computer. Combinations of the above may also be included within the scope of computer-readable media.

Computer-executable instructions may include, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modules running on a computing system.

All examples and conditional language recited herein are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A system configured to perform complementary signal mixing, the system comprising:
   a complement generation module configured to:
      receive an oscillator signal and a digital baseband I-channel signal that includes an I-channel symbol, the plurality of I-channel gates configured to perform an exclusive OR (XOR) function with respect to the I-channel symbol and the oscillator signal such that bits of an I-channel output signal that is based on an output of the plurality of I-channel logic gates alternate between the I-channel symbol and a complement of the I-channel symbol in response to the oscillator signal rising and falling;
      receive the oscillator signal and a digital baseband Q-channel signal that includes a Q-channel symbol, the plurality of Q-channel gates configured to perform the XOR function with respect to the Q-channel symbol and the oscillator signal such that bits of a Q-channel output signal that is based on an output of the plurality of Q-channel logic gates alternate between the Q-channel symbol and a complement of the Q-channel symbol in response to the oscillator signal rising and falling; and
   a combining module configured to combine the I-channel output signal and the Q-channel output signal based on adding operations performed with respect to an I-channel extra bit signal, a Q-channel extra bit signal, the I-channel output signal, and the Q-channel output signal to generate a complementary mixed signal having a frequency based on a clock frequency of the oscillator signal and including information included in the I-channel symbol and the Q-channel symbol.

2. The system of claim 1, wherein the complement generation module comprises a phase-adjusting module configured to:
   receive an intermediate I-channel signal that is based on the output of the plurality of I-channel gates;
   receive an intermediate Q-channel signal that is based on the output of the plurality of Q-channel gates; and
   adjust an I-channel phase of the intermediate I-channel signal with respect to a Q-channel phase of the intermediate Q-channel signal to generate the I-channel output signal and the Q-channel output signal such that the I-channel output signal and Q-channel output signal are substantially 90 degrees out of phase with each other.

3. The system of claim 2, wherein the phase-adjusting module comprises:
an I-channel delay module configured to delay the intermediate I-channel signal by substantially one-half of a clock period of the oscillator signal to generate the I-channel output signal; and
a Q-channel delay module configured to delay the intermediate Q-channel signal by substantially one-fourth of the clock period to generate the Q-channel output signal, or wherein:
the I-channel delay module is configured to delay the intermediate I-channel signal by substantially one-fourth of the clock period to generate the I-channel output signal; and
the Q-channel delay module is configured to delay the intermediate Q-channel signal by substantially one-half of the clock period to generate the Q-channel output signal.

4. The system of claim 2, wherein the phase-adjusting module is configured to:
delay the intermediate I-channel signal with respect to the intermediate Q-channel signal by substantially one-fourth of a clock period of the oscillator signal; or
delay the intermediate Q-channel signal with respect to the intermediate I-channel signal by substantially one-fourth of the clock period.

5. The system of claim 1, wherein:
the complement generation module is further configured to:
combine the I-channel extra bit signal with the I-channel output signal to generate an extended I-channel output signal, a least significant bit of the I-channel output signal being based on the I-channel extra bit signal; and
combine the Q-channel extra bit signal with the Q-channel output signal to generate an extended Q-channel output signal, a least significant bit of the Q-channel output signal being based on the Q-channel extra bit signal; and
the combining module is configured to:
add the I-channel extra bit signal, the extended I-channel output signal, and the extended Q-channel output signal together to generate an adder output signal; and
add the Q-channel extra bit signal with the adder output signal during a digital-to-analog conversion of the adder output signal to generate the complementary mixed signal; or
add the Q-channel extra bit signal, the extended I-channel output signal, and the extended Q-channel output signal together to generate the adder output signal; and
add the I-channel extra bit signal with the adder output signal during the digital-to-analog conversion of the adder output signal to generate the complementary mixed signal.

6. The system of claim 5, wherein:
the combining module is configured to remove a least significant bit of the sum of the I-channel extra bit signal, the extended I-channel output signal, and the extended Q-channel output signal to generate the adder output signal; or
the combining module is configured to remove a least significant bit of the sum of the Q-channel extra bit signal, the extended I-channel output signal, and the extended Q-channel output signal to generate the adder output signal.

7. The system of claim 1, wherein the complement generation module is further configured to:
receive the oscillator signal and an I-channel extra bit control signal and is configured to perform the XOR function with respect to the oscillator signal and the I-channel extra bit control signal to generate the I-channel extra bit signal such that the I-channel extra bit signal alternates between "LOW" and "HIGH" in response to the oscillator signal rising and falling; and
receive the oscillator signal and a Q-channel extra bit control signal and is configured to perform the XOR function with respect to the oscillator signal and the Q-channel extra bit control signal to generate the Q-channel extra bit signal such that the Q-channel extra bit signal alternates between "LOW" and "HIGH" in response to the oscillator signal rising and falling.

8. The system of claim 1, wherein:
the complement generation module includes an I-channel logic gate corresponding to a most significant bit of the I-channel symbol configured to receive a two's complement control signal to adjust for the I-channel symbol having a two's complement format or an unsigned binary code format; and
the complement generation module includes a Q-channel logic gate corresponding to a most significant bit of the Q-channel symbol configured to receive the two's complement control signal to adjust for the Q-channel symbol having the two's complement format or the unsigned binary code format.

9. The system of claim 1, wherein the combining module includes:
an adding module configured to add the I-channel extra bit signal, the Q-channel extra bit signal, the I-channel output signal, and the Q-channel output signal together to generate an adder output signal; and
a summing digital-to-analog converter configured to perform an adding operation with respect to the adder output signal during a digital-to-analog conversion of the adder output signal to generate the complementary mixed signal.

10. The system of claim 1, wherein the combining module includes:
a first summing digital-to-analog converter configured to perform an adding operation with respect to the I-channel extra bit signal and the I-channel output signal during a digital-to-analog conversion of the I-channel output signal to generate a modulated I-channel signal;
a second summing digital-to-analog converter configured to perform an adding operation with respect to the Q-channel extra bit signal and the Q-channel output signal during a digital-to-analog conversion of the Q-channel output signal to generate a modulated Q-channel signal; and
a signal mixer configured to combine the modulated I-channel signal with the modulated Q-channel signal to generate the complementary mixed signal.

11. A method of performing complementary signal mixing, the method comprising:
performing an exclusive OR (XOR) function with respect to an I-channel symbol based on an oscillator signal to produce an I-channel output signal with bits that alternate between the I-channel symbol and a complement of the I-channel symbol in response to the oscillator signal rising and falling;

performing the XOR function with respect to a Q-channel symbol based on the oscillator signal to produce a Q-channel output signal with bits that alternate between the Q-channel symbol and a complement of the Q-channel symbol in response to the oscillator signal rising and falling; and combining the I-channel output signal and the Q-channel output signal based on adding operations performed with respect to an I-channel extra bit signal, a Q-channel extra bit signal, the I-channel output signal, and the Q-channel output signal to generate a complementary mixed signal having a frequency based on a clock frequency of the oscillator signal and including information included in the I-channel symbol and the Q-channel symbol.

12. The method of claim 11, further comprising:

generating an intermediate I-channel signal based on performing the XOR function with respect to the I-channel symbol;

generating an intermediate Q-channel signal based on performing the XOR function with respect to the Q-channel symbol; and adjusting an I-channel phase of the intermediate I-channel signal with respect to a Q-channel phase of the intermediate Q-channel signal to generate the I-channel output signal and the Q-channel output signal such that the I-channel output signal and Q-channel output signal are substantially 90 degrees out of phase with each other.

13. The method of claim 12, further comprising:

delaying the intermediate I-channel signal by substantially one-half of a clock period of the oscillator signal to generate the I-channel output signal; and delaying the intermediate Q-channel signal by substantially one-fourth of the clock period to generate the Q-channel output signal, or;

delaying the intermediate I-channel signal by substantially one-fourth of the clock period to generate the I-channel output signal; and delaying the intermediate Q-channel signal by substantially one-half of the clock period to generate the Q-channel output signal.

14. The method of claim 12, further comprising:

delaying the intermediate I-channel signal with respect to the intermediate Q-channel signal by substantially one-fourth of a clock period of the oscillator signal; or delaying the intermediate Q-channel signal with respect to the intermediate I-channel signal by substantially one-fourth of the clock period.

15. The method of claim 11, further comprising:

combining the I-channel extra bit signal with the I-channel output signal to generate an extended I-channel output signal, a least significant bit of the I-channel output signal being based on the I-channel extra bit signal; and combining the Q-channel extra bit signal with the Q-channel output signal to generate an extended Q-channel output signal, a least significant bit of the Q-channel output signal being based on the Q-channel extra bit signal;

adding the I-channel extra bit signal, the extended I-channel output signal, and the extended Q-channel output signal together to generate an adder output signal; and adding the Q-channel extra bit signal with the adder output signal during a digital-to-analog conversion of the adder output signal to generate the complementary mixed signal, or:

adding the Q-channel extra bit signal, the extended I-channel output signal, and the extended Q-channel output signal together to generate the adder output signal; and adding the I-channel extra bit signal with the adder output signal during the digital-to-analog conversion of the adder output signal to generate the complementary mixed signal.

16. The method of claim 15, further comprising:

removing a least significant bit of the sum of the I-channel extra bit signal, the extended I-channel output signal, and the extended Q-channel output signal to generate the adder output signal; or removing a least significant bit of the sum of the Q-channel extra bit signal, the extended I-channel output signal, and the extended Q-channel output signal to generate the adder output signal.

17. The method of claim 11, further comprising:

receiving the oscillator signal and an I-channel extra bit control signal and performing the XOR function with respect to the oscillator signal and the I-channel extra bit control signal to generate the I-channel extra bit signal such that the I-channel extra bit signal alternates between "LOW" and "HIGH" in response to the oscillator signal rising and falling; and receiving the oscillator signal and a Q-channel extra bit control signal and performing the XOR function with respect to the oscillator signal and the Q-channel extra bit control signal to generate the Q-channel extra bit signal such that the Q-channel extra bit signal alternates between "LOW" and "HIGH" in response to the oscillator signal rising and falling.

18. The method of claim 11, further comprising:

adjusting for the I-channel symbol having a two's complement format or an unsigned binary code format; and adjusting for the Q-channel symbol having the two's complement format or the unsigned binary code format.

19. The method of claim 11, further comprising:

adding the I-channel extra bit signal, the Q-channel extra bit signal, the I-channel output signal, and the Q-channel output signal together to generate an adder output signal; and performing an adding operation with respect to the adder output signal during a digital-to-analog conversion of the adder output signal to generate the complementary mixed signal.

20. The method of claim 11, further comprising:

performing a first adding operation with respect to the I-channel extra bit signal and the I-channel output signal during a digital-to-analog conversion of the I-channel output bit signal to generate a modulated I-channel signal;

performing a second adding operation with respect to the Q-channel extra bit signal and the Q-channel output signal during a digital-to-analog conversion of the Q-channel output signal to generate a modulated Q-channel signal; and combining the modulated I-channel signal with the modulated Q-channel signal to generate the complementary mixed signal.

\* \* \* \* \*